United States Patent
Hoshino et al.

(10) Patent No.: US 12,162,762 B2
(45) Date of Patent: Dec. 10, 2024

(54) POLYCRYSTALLINE SILICON ROD

(71) Applicant: Shin-Etsu Chemical Co., Ltd., Tokyo (JP)

(72) Inventors: Naruhiro Hoshino, Niigata (JP); Shigeyoshi Netsu, Niigata (JP); Tetsuro Okada, Niigata (JP); Masahiko Ishida, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 366 days.

(21) Appl. No.: 17/502,996

(22) Filed: Oct. 15, 2021

(65) Prior Publication Data

US 2022/0033267 A1 Feb. 3, 2022

Related U.S. Application Data

(62) Division of application No. 16/418,162, filed on May 21, 2019, now abandoned.

(30) Foreign Application Priority Data

Jun. 4, 2018 (JP) .................................. 2018-106564

(51) Int. Cl.
C01B 33/035 (2006.01)
(52) U.S. Cl.
CPC ........ C01B 33/035 (2013.01); *C01P 2002/70* (2013.01); *C01P 2004/16* (2013.01)
(58) Field of Classification Search
None
See application file for complete search history.

(56) References Cited

U.S. PATENT DOCUMENTS

| | | | |
|---|---|---|---|
| 4,722,764 A | 2/1988 | Herzer et al. | |
| 2008/0286550 A1* | 11/2008 | Sofin | C01B 33/035 427/248.1 |
| 2010/0266902 A1 | 10/2010 | Takano et al. | |
| 2014/0004377 A1 | 1/2014 | Kaito | |
| 2015/0047554 A1* | 2/2015 | Miyao | C30B 25/02 117/37 |

(Continued)

FOREIGN PATENT DOCUMENTS

| | | |
|---|---|---|
| EP | 2 104 175 A2 | 9/2009 |
| JP | S60-65787 A | 4/1985 |

(Continued)

OTHER PUBLICATIONS

Translation for Miyao JP 2014031297 (Year: 2014).*

(Continued)

*Primary Examiner* — Michael Forrest
(74) *Attorney, Agent, or Firm* — WHDA, LLP

(57) ABSTRACT

Provided is a polycrystalline silicon rod suitable as a raw material for production of single-crystalline silicon. A crystal piece (evaluation sample) is collected from a polycrystalline silicon rod grown by a Siemens method, and a polycrystalline silicon rod in which an area ratio of a crystal grain having a particle size of 100 nm or less is 3% or more is sorted out as the raw material for production of single-crystalline silicon. When single-crystalline silicon is grown by an FZ method using the polycrystalline silicon rod as a raw material, the occurrence of dislocation is remarkably suppressed.

11 Claims, 2 Drawing Sheets

(56) References Cited

U.S. PATENT DOCUMENTS

| 2015/0107508 | A1 |   | 4/2015  | Ishida et al. |              |
|--------------|----|---|---------|---------------|--------------|
| 2017/0210630 | A1 |   | 7/2017  | Miyao et al.  |              |
| 2017/0234682 | A1 |   | 8/2017  | Miyao et al.  |              |
| 2018/0002180 | A1 | * | 1/2018  | Miyao         | C01B 33/035  |
| 2018/0244527 | A1 |   | 8/2018  | Miyao et al.  |              |

FOREIGN PATENT DOCUMENTS

| JP | 2008-285403  | A |   | 11/2008 |           |
|----|--------------|---|---|---------|-----------|
| JP | 2009-224168  | A |   | 10/2009 |           |
| JP | 2013-193902  | A |   | 9/2013  |           |
| JP | 2014-28747   | A |   | 2/2014  |           |
| JP | 2014-31297   | A |   | 2/2014  |           |
| JP | 2014031297   | A | * | 2/2014  |           |
| JP | 2016-41636   | A |   | 3/2016  |           |
| JP | 2016150885   | A | * | 8/2016  | C01B 33/02 |
| JP | 2017-57093   | A |   | 3/2017  |           |
| JP | 2017-141137  | A |   | 8/2017  |           |
| WO | 2009/063801  | A1|   | 5/2009  |           |

OTHER PUBLICATIONS

Extended European Search Report dated Jul. 22, 2019, issued in counterpart European Patent application No. 19177986.7. (8 pages).
Office Action dated Mar. 16, 2021, issued in counterpart JP Application No. 2018-106564 (4 pages).
Richter et al (Influence of slim rod material properties to the Siemens feed rod and the float zone process, Energy Procedia 55 (2014) 596-601). (Year: 2014).

* cited by examiner

POLYCRYSTALLINE SILICON ROD

CROSS-REFERENCE TO RELATED APPLICATIONS

This application is a divisional of U.S. application Ser. No. 16/418,162, filed on May 21, 2019, which claims priority to Japanese priority application No. 2018-106564 filed on Jun. 4, 2018, which are hereby incorporated by reference.

BACKGROUND OF THE INVENTION

Field of the Invention

The present invention relates to a polycrystalline silicon rod grown by a Siemens method, and particularly relates to a polycrystalline silicon rod suitable as a raw material for production of single-crystalline silicon according to a floating zone method (FZ method).

Description of the Related Art

Polycrystalline silicon is used as a raw material for semiconductor single-crystalline silicon or solar cell silicon. As a method for producing polycrystalline silicon, the Siemens method has been widely known. The Siemens method generally includes contacting a silane source gas with a heated silicon core to deposit polycrystalline silicon on the surface of the silicon core using a chemical vapor deposition (CVD) method.

When a polycrystalline silicon rod is produced by the Siemens method, two vertical silicon cores and one horizontal silicon core are assembled in a square arch shape (inverted U shape). The end parts of the silicon cores assembled in the square arch shape are each connected to a core holder, and the core holders are fixed on a pair of metal electrodes arranged on a base plate. In general, in a reactor, a plurality of sets of the square arch shaped silicon cores are arranged.

When the square arch shaped silicon cores are heated to a deposition temperature by applying current, and for example, a mixed gas of trichlorosilane and hydrogen as a source gas is contacted with the silicon cores, silicon is vapor-phase grown to form polycrystalline silicon having a desired diameter in an inverted U shape.

In production of single-crystalline silicon according to the Czochralski method (CZ method), a quartz crucible is filled with a polycrystalline silicon chunk obtained by crushing the inverted U-shaped polycrystalline silicon rod, and the crucible is heated to melt the polycrystalline silicon chunk to obtain a silicon melt. The silicon melt is contacted with a seed crystal to grow a single-crystalline silicon ingot.

It has been known that, if unmelted polycrystalline silicon remains and floats in the silicon melt when the single-crystalline silicon is grown by the CZ method, the unmelted polycrystalline silicon causes the occurrence of dislocation.

In production of single-crystalline silicon according to the FZ method, both end parts of two vertical polycrystalline silicon portions of the polycrystalline silicon formed in the inverted U shape are separated to obtain a cylindrical polycrystalline silicon rod. The polycrystalline silicon rod is used as a raw material.

Japanese Patent Laid-Open No. 2008-285403 reports that, when a polycrystalline silicon rod is produced, a needle crystal having an inhomogeneous microstructure may be deposited. Japanese Patent Laid-Open No. 2008-285403 reports that, when single crystal growth is performed according to the FZ method using the polycrystalline silicon rod in which the needle crystal has been deposited as a raw material, the inhomogeneous microstructure of the polycrystalline silicon rod causes each of crystallites to be non-uniformly melted, and the unmelted crystallite reaches a solid-liquid interface of single-crystalline silicon being grown through a melting zone, thereby causing dislocation.

Once the dislocation occurs, the single-crystalline silicon ingot cannot be obtained any longer, and as a result the production yield decreases.

For this reason, in techniques disclosed in Japanese Patent Laid-Open No. 2008-285403 and Japanese Patent Laid-Open No. 2014-28747, proposals have been made in order to suppress the occurrence of the needle crystal.

For example, Japanese Patent Laid-Open No. 2013-193902 discloses an invention of a polycrystalline silicon rod preferably used as a production raw material of a silicon single crystal according to the CZ method or a production raw material of a silicon ingot according to a casting method, and reports that the coarsening of a crystal grain tends to decrease the amount of energy required for melting.

Furthermore, Japanese Patent Laid-Open No. 2014-31297 and Japanese Patent Laid-Open No. 2017-057093 disclose an invention in which defect formation when single-crystalline silicon is grown is suppressed by setting the crystal grain size of a polycrystalline silicon rod to a suitable range.

However, according to investigations by the present inventors, it has become clear that the measures disclosed in the prior art literature make it difficult to make sure to suppress the occurrence of the dislocation when the single-crystalline silicon is grown in the FZ method or the CZ method.

It is an object of the present invention to provide a polycrystalline silicon rod which can remarkably suppress the occurrence of dislocation when single-crystalline silicon is produced, particularly when the single-crystalline silicon is produced by the FZ method.

SUMMARY OF THE INVENTION

In order to solve the above-mentioned problem, a polycrystalline silicon rod according to the present invention is a polycrystalline silicon rod grown by a Siemens method, wherein, when a crystal piece is collected from a region excluding a portion corresponding to a silicon core, and evaluated, an area ratio of a crystal grain having a particle size of 100 nm or less is 3% or more.

The crystal piece has a principal surface set in an axis direction of the silicon core, for example.

The crystal piece has a principal surface set in a radial direction perpendicular to an axis direction of the silicon core, for example.

In the polycrystalline silicon rod, the area ratio of the crystal grain of 100 nm or less is preferably 6% or more.

The polycrystalline silicon rod is grown by using trichlorosilane or monosilane as a raw material, for example.

When single-crystalline silicon is grown by using a polycrystalline silicon rod according to the present invention as a raw material, the occurrence of dislocation can be remarkably suppressed, and the polycrystalline silicon rod is particularly suitable as a raw material for production of single-crystalline silicon according to the FZ method.

DETAILED DESCRIPTION OF THE PREFERRED EMBODIMENTS

Figure 1:
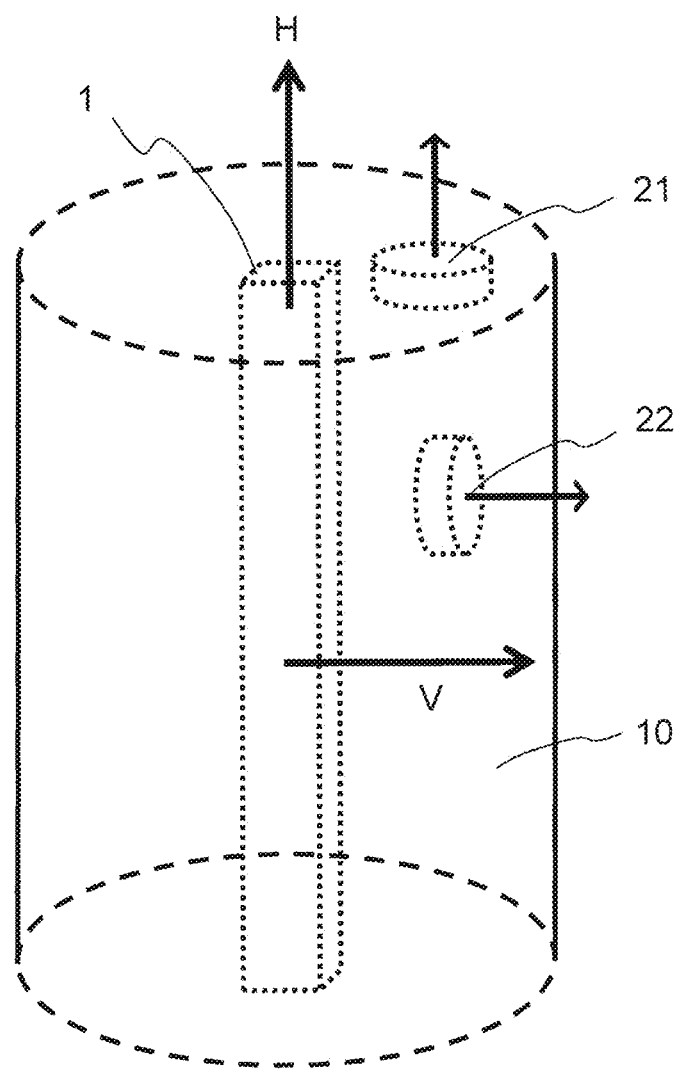
FIG. 1 is a schematic illustration diagram showing a collecting example of an observation sample cut out from a polycrystalline silicon rod.

Hereinafter, with reference to the drawings, a polycrystalline silicon rod according to the present invention will be described. Herein, particularly, the examination results obtained from the production of single-crystalline silicon according to the FZ method will be reported. The polycrystalline silicon rod according to the present invention is also suitable as a raw material for production of single-crystalline silicon according to the CZ method.

Heretofore, the present inventors have made studies of the problem of what a polycrystalline silicon rod suitable as a raw material for production of single-crystalline silicon is. At first, the present inventors have made studies focusing on a crystal grain and needle crystal having a relatively large size of 500 nm or more as a factor for the occurrence of dislocation.

However, when the present inventors have made further studies, it has become clear that the probability of the occurrence of the dislocation when single-crystalline silicon is grown by the FZ method is not necessarily low even if the content of the crystal grain and needle crystal having a relatively large size is set to a specific range.

In particular, it has been found that, when the single-crystalline silicon is grown by the FZ method, polycrystalline silicon is not uniformly melted even if no crystallites having a relatively large particle size of 500 nm or more are present in the polycrystalline silicon rod as a raw material, which frequently causes the occurrence of the dislocation. Then, rather, the present inventors have made studies focusing on a crystal grain and needle crystal having a relatively small size.

Herein, the crystal grain size is calculated as an average value of a diameter in a minor axis direction and a diameter in a major axis direction in the case of observation using, for example, an optical microscope. For example, in the case of evaluation using an electron backscattering diffraction method (EBSD method), the crystal grain size is defined as the diameter of a circle having the area obtained for each of the crystal grains detected by the analysis of an electron backscattering diffraction image, as disclosed in Japanese Patent Laid-Open No. 2014-31297.

According to previous studies, it has become clear that, when single-crystalline silicon is grown by using as a raw material a polycrystalline silicon rod in which the area ratio of a crystal grain having a crystal grain size of 100 nm or less calculated by analysis using the electron backscattering diffraction method (EBSD method) and observation under the optical microscope is 3% or more, the probability of dislocation is remarkably low.

The present inventors consider the following mechanism to be the reason. When the area ratio of a crystal grain having a crystal grain size of 100 nm or less is 3% or more, the crystal grain having a relatively small size is present at a grain boundary between crystal grains having a relatively large crystal grain to provide an increased degree of adhesion of the crystal grains. As a result, when the polycrystalline silicon rod is melted, the relatively large crystal grain independently floats in a silicon melt to suppress the induction of the dislocation.

FIG. 1 is a schematic illustration diagram showing a collecting example of an observation sample cut out from a polycrystalline silicon rod 10. When the area ratio of a crystal grain having a particle size of 100 nm or less is calculated, a crystal piece 21 having a principal surface set in the axis direction (H direction) of a silicon core 1 may be used. A crystal piece 22 having a principal surface set in a radial direction (V direction) perpendicular to the axis direction of the silicon core 1 may be used. The method for collecting the crystal piece is not limited to the above-mentioned methods, and the direction of the principal surface of the crystal piece is optional. However, the crystal piece is collected from a region excluding a portion corresponding to the silicon core 1.

The raw material used when the polycrystalline silicon rod is grown is not particularly limited, and monosilane and trichlorosilane are preferably used.

The use of the monosilane as a source gas for production of polycrystalline silicon (silane-based gas) provides a low CVD temperature without causing generation of hydrochloric acid as a byproduct when silicon is produced. The use of the monosilane is likely to provide nucleation, whereby polycrystalline silicon having a fine crystal grain size can be grown.

Meanwhile, when the trichlorosilane is used as the source gas for production of polycrystalline silicon, the occurrence of a Si powder caused by thermal decomposition when the monosilane is used as the raw material is suppressed. By controlling the concentration and growth temperature of the source gas, the crystal grain size is relatively easily controlled, whereby polycrystalline silicon having a fine crystal grain size can be grown.

EXAMPLES

Experiment 1

First, five kinds of polycrystalline silicon rods (rods A to E) were prepared under different deposition conditions according to the Siemens method using trichlorosilane as a raw material, and a crystal piece (evaluation sample) having a principal surface set in a radial direction perpendicular to the axis direction of a silicon core was collected from each of the polycrystalline silicon rods.

Figure 2:
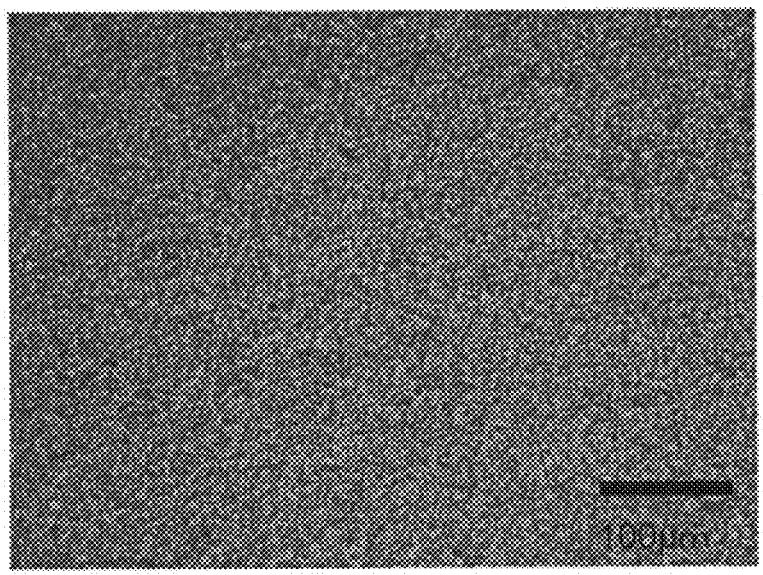
FIG. 2 is a photograph when a polycrystalline silicon rod as a rod A is observed with an optical microscope.
Figure 3:
FIG. 3 is a photograph when a polycrystalline silicon rod as a rod E is observed with an optical microscope.

Each of the samples was analyzed (magnification ratio: 5,000 times) by an EBSD method to obtain a crystal grain size distribution from the obtained image. FIGS. 2 and 3 show photographs when polycrystalline silicon rods as the rods A and E are observed with an optical microscope. A crystal grain size distribution (a crystal grain size distribution at an area ratio) for each of the samples and a "yield" when the polycrystalline silicon rod was used as the raw material for production of single-crystalline silicon according to the FZ method were summarized in Table 1.

When a length single-crystallized without causing the occurrence of dislocation in the case where the single-crystalline silicon is grown by the FZ method is 100%, the "yield" herein is a ratio of a length from a single crystallization start position to a position at which dislocation occurs, to the length of 100%. When the polycrystalline silicon rod is single-crystallized without causing the occurrence of dislocation, the yield is 100%. Five polycrystalline silicon rods are prepared for each of the rods A to E. Five batches of single-crystalline silicons are grown by using the five polycrystalline silicon rods, and the "yield" is calculated from the average value.

TABLE 1

| | Crystal grain size distribution (%) at surface ratio (x: crystal grain size) | | | | | | |
|---|---|---|---|---|---|---|---|
| Rod | x ≤ 100 nm | 100 nm < x ≤ 500 nm | 500 nm < x ≤ 3 μm | 3 μm < x ≤ 5 μm | 5 μm < x ≤ 10 μm | 10 μm < x | Yield (%) |
| A | 9 | 40 | 21 | 12 | 10 | 8 | 100 |
| B | 3 | 36 | 25 | 19 | 12 | 5 | 83 |
| C | 2 | 26 | 30 | 22 | 10 | 10 | 73 |
| D | 0 | 10 | 35 | 43 | 10 | 2 | 30 |
| E | 0 | 3 | 6 | 18 | 23 | 50 | 3 |

As shown in Table 1, in the rods (A and B) in which the area ratio of a crystal grain having a particle size of 100 nm or less was 3% or more, the yield was more than 80%, and as a result, the yield of the rod A in which the area ratio value was 9% was 100%.

Experiment 2

In addition to the rods A and B, three kinds of polycrystalline silicon rods (rods F to H) were prepared under different deposition conditions by the Siemens method using trichlorosilane as a raw material. A crystal piece (evaluation sample) having a principal surface set in the axis direction of a silicon core as a direction different from that of "experiment 1" was collected from each of the five kinds of polycrystalline silicon rods.

Each of the samples was analyzed (magnification ratio: 5,000 times) by an EBSD method, and a crystal grain size distribution was obtained from the obtained image. A crystal grain size distribution (a crystal grain size distribution at an area ratio) for each of the samples and a "yield" when the polycrystalline silicon rod was used as the raw material for production of single-crystalline silicon by the FZ method were summarized in Table 2. The meaning of the "yield" is as described above.

TABLE 2

| | Crystal grain size distribution (%), Surface ratio, Crystal grain size: x | | | | | | |
|---|---|---|---|---|---|---|---|
| Rod | x ≤ 100 nm | 100 nm < x ≤ 500 nm | 500 nm < x ≤ 3 μm | 3 μm < x ≤ 5 μm | 5 μm < x ≤ 10 μm | 10 μm < x | Yield (%) |
| A | 6 | 26 | 23 | 17 | 16 | 12 | 100 |
| B | 4 | 19 | 26 | 26 | 13 | 12 | 83 |
| F | 3 | 35 | 29 | 18 | 10 | 5 | 80 |
| G | 0 | 1 | 8 | 15 | 53 | 23 | 23 |
| H | 0 | 3 | 6 | 12 | 16 | 63 | 2 |

As shown in Table 2, in the rods (A, B, F) in which the area ratio of a crystal grain having a particle size of 100 nm or less was 3% or more, the yield was more than 80%, and as a result, the yield of the rod A in which the area ratio value was 6% was 100%.

That is, it became clear that, when the crystal piece is collected from a region excluding a portion corresponding to a silicon core, and evaluated, the polycrystalline silicon rod in which the area ratio of the crystal grain having a particle size of 100 nm or less is 3% or more shows an extremely high yield.

For the rods A and B, a slight difference occurred in the area ratio of the crystal grain having a particle size of 100 nm or less according to the collecting direction of the crystal piece. Even in such a case, it became clear that the polycrystalline silicon rod in which the area ratio of the crystal grain having a size of 100 nm or less is 6% or more shows a yield of 100%.

As described above, the polycrystalline silicon rod according to the present invention is suitable as the raw material for production of single-crystalline silicon.

The present invention is also a method for sorting out a polycrystalline silicon rod suitable as a raw material for production of single-crystalline silicon.

That is, when the crystal piece is collected from the region excluding the portion corresponding to the silicon core, and evaluated in the method for sorting out the polycrystalline silicon rod grown by the Siemens method, the polycrystalline silicon rod in which the area ratio of the crystal grain having a particle size of 100 nm or less is 3% or more is sorted out as the raw material for production of single-crystalline silicon.

The present invention provides the polycrystalline silicon rod suitable as the raw material for production of single-crystalline silicon.

REFERENCE SIGNS LIST

1: silicon core
10: polycrystalline silicon rod
21, 22: evaluation sample (crystal piece)

What is claimed is:

1. A method of manufacturing a single-crystalline silicon comprising sorting out a polycrystalline silicon rod having an area ratio of a crystal grain having a particle size of 100 nm or less of 3% or more as a raw material of single-crystalline silicon.

2. The method of manufacturing a single-crystalline silicon according to claim 1, wherein the area ratio of the crystal grain of 100 nm or less is 6% or more.

3. The method of manufacturing a single-crystalline silicon according to claim 1, wherein the polycrystalline silicon rod is grown by using trichlorosilane or monosilane as a raw material.

4. The method of manufacturing a single-crystalline silicon according to claim 1, wherein the area ratio is determined from a crystal piece obtained from the polycrystalline silicon rod, wherein the crystal piece has a principal surface set in an axis direction of a silicon core.

5. The method of manufacturing a single-crystalline silicon according to claim 4, wherein the area ratio of the crystal grain of 100 nm or less is 6% or more.

6. The method of manufacturing a single-crystalline silicon according to claim 4, wherein the polycrystalline silicon rod is grown by using trichlorosilane or monosilane as a raw material.

7. The method of manufacturing a single-crystalline silicon according to claim 1, wherein the area ratio is determined from a crystal piece obtained from the polycrystalline silicon rod, wherein the crystal piece has a principal surface set in a radial direction perpendicular to an axis direction of a silicon core.

8. The method of manufacturing a single-crystalline silicon according to claim 7, wherein the area ratio of the crystal grain of 100 nm or less is 6% or more.

9. The method of manufacturing a single-crystalline silicon according to claim 7, wherein the polycrystalline silicon rod is grown by using trichlorosilane or monosilane as a raw material.

10. The method of manufacturing a single-crystalline silicon according to claim 1, wherein the area ratio of the crystal grain of 100 nm or less is 9% or less.

11. The method of manufacturing a single-crystalline silicon according to claim 1, wherein a yield is 80% or more.

* * * * *